(12) United States Patent
Baumann et al.

(10) Patent No.: US 6,596,456 B2
(45) Date of Patent: Jul. 22, 2003

(54) USE OF CINNAMIC ACID GROUPS CONTAINING ACETAL POLYMERS FOR RADIATION-SENSITIVE COMPOSITIONS AND LITHOGRAPHIC PRINTING PLATES

(75) Inventors: Harald Baumann, Osterode/Harz (DE); Michael Flugel, Osterode/Harz (DE); Eduard Kottmair, Ebenhausen (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/119,392

(22) Filed: Apr. 11, 2002

(65) Prior Publication Data

US 2003/0091925 A1 May 15, 2003

Related U.S. Application Data

(63) Continuation of application No. 09/866,899, filed on May 29, 2001.

(51) Int. Cl.$^7$ .............................. G03F 7/021; G03F 7/30; C08F 16/38
(52) U.S. Cl. ...................... 430/175; 430/157; 430/176; 430/302; 525/56; 525/61
(58) Field of Search ................................ 430/157, 175, 430/176, 302; 525/56, 61

(56) References Cited

U.S. PATENT DOCUMENTS

| | | | |
|---|---|---|---|
| 2,690,966 A | 10/1954 | Minsk et al. ..................... | 97/7 |
| 2,787,546 A | 4/1957 | Smith et al. .................. | 96/115 |
| 2,861,058 A | 11/1958 | Unruh et al. .............. | 260/78.5 |
| 3,030,280 A | 4/1962 | Scheilenberg .................. | 96/35 |
| 3,622,320 A | 11/1971 | Allen ........................... | 96/28 |
| 3,929,489 A | 12/1975 | Arcesi et al. ............. | 96/115 R |
| 4,419,437 A | 12/1983 | Noonan et al. ............. | 430/270 |
| 4,478,977 A | 10/1984 | Sperry et al. .................. | 525/61 |
| 4,777,114 A | * 10/1988 | Ichimura et al. ......... | 430/270.1 |
| 5,275,907 A | * 1/1994 | Walls ........................ | 430/157 |
| 5,700,619 A | * 12/1997 | Baumann et al. ............ | 430/175 |
| 5,925,491 A | * 7/1999 | Baumann et al. ........... | 430/175 |
| 5,985,996 A | 11/1999 | Baumann et al. ............. | 525/59 |

FOREIGN PATENT DOCUMENTS

| | | |
|---|---|---|
| EP | 0252152 | 1/1988 |
| EP | 0752430 | 1/1997 |
| EP | 0757061 | 2/1997 |
| EP | 0838478 | 4/1998 |
| EP | 0996037 | 4/2000 |
| GB | 1274017 | 5/1972 |
| WO | 93/03068 | 2/1993 |

OTHER PUBLICATIONS

International Search Report dated Sep. 12, 2002 to Application No. PCT/US02/15192 (corresponding PCT Application).

* cited by examiner

Primary Examiner—John S. Chu
(74) Attorney, Agent, or Firm—RatnerPrestia

(57) ABSTRACT

Copolymers containing the units A, B, C, D and optionally E are used to prepare radiation sensitive compositions and lithographic printing plates. The copolymer contains about 25 to 55 mol % of unit A which has the formula

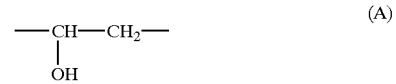

The copolymer contains about 0.5 to 25 mol % of unit B which has the formula

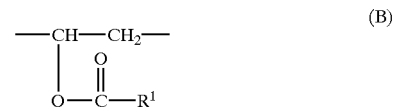

wherein $R^1$ is selected from the group consisting of alkyl, aryl and aralkyl.

The copolymer contains about 0.5 to 40 mol % of unit C which has the formula

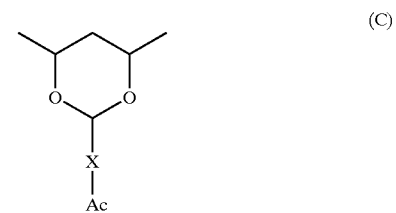

wherein X is an aliphatic or aromatic spacer group, and Ac is an acidic group selected from the group consisting of —COOH, —SO$_3$H, —SO$_2$NR$^9$R$^{10}$ with R$^9$ and R$^{10}$ independently being selected from hydrogen and alkyl; and when X is phenylene, Ac can also be OH.

The copolymer contains about 20 to 70 mol % of unit D which has the formula

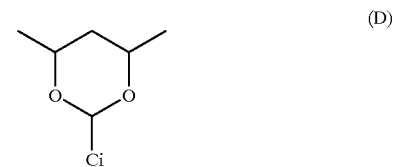

wherein Ci is selected from the group consisting of Ci-1, Ci-2, Ci-3 and Ci-4 which are represented by the following formulae (Ci-1) 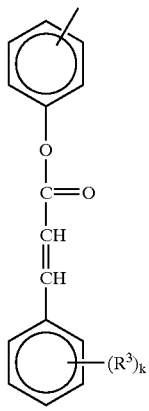

(Ci-4) 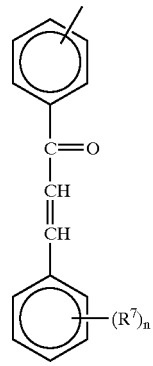

-continued (Ci-2) 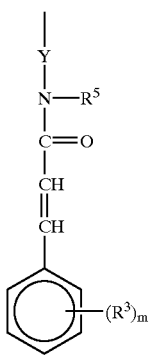

(Ci-3) 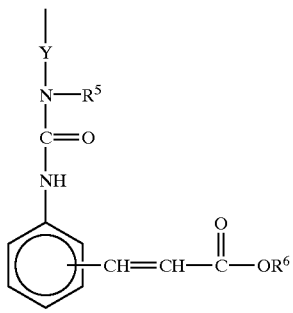

wherein:
k, m and n are integers independently selected from 0 to 5,
$R^3$, $R^4$ and $R^7$ are independently selected from the group consisting of alkyl, alkoxy, —$COOR^8$, —$NR^9R^{10}$, —NH—CO—$CH_3$, halogen, and cyano,
$R^8$ is selected from hydrogen and alkyl,
$R^9$ and $R^{10}$ are independently selected from hydrogen and alkyl,
$R^5$ is selected from the group consisting of hydrogen, alkyl, aryl and aralkyl,
$R^6$ is selected from the group consisting of alkyl, aryl and aralkyl and
Y is selected from the group consisting of alkylene, arylene and arylenealkylene.

The copolymer contains about 0 to 50 mol % of unit E which has the formula (E) 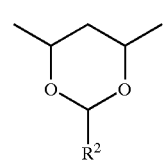

wherein $R^2$ is selected from the group consisting of alkyl, aryl and aralkyl groups.

24 Claims, No Drawings

USE OF CINNAMIC ACID GROUPS CONTAINING ACETAL POLYMERS FOR RADIATION-SENSITIVE COMPOSITIONS AND LITHOGRAPHIC PRINTING PLATES

CROSS-REFERENCE TO RELATED APPLICATIONS

This application is a continuation of U.S. application Ser. No. 09/866,899, filed May 29, 2001, incorporated herein by reference.

FIELD OF THE INVENTION

The present invention relates to binders and radiation-sensitive compositions comprising said binders and, Inter alia, are excellently suitable for the production of lithographic plates.

BACKGROUND OF THE INVENTION

Currently, photosensitive compositions usable particularly for high-performance lithographic plates must fulfill high requirements.

In order to improve the properties of photosensitive compositions and thus also of the corresponding lithographic plates, essentially two different ways are taken. One of them deals with the improvement of the properties of the photosensitive components in the compositions (frequently negative diazo resins, photo polymers etc.), the other one with the search for novel polymeric compounds ("binders"), which are to control the physical properties of the photosensitive layers. In particular the latter way is decisive for lithographic plates because the behavior in the developing and printing processes (such as developability, ink receptivity, scratch resistance, consistency in the number of prints produced) is decisively influenced by the polymeric binders. Also shelf life and photosensitivity of the materials are strongly influenced by such polymeric compounds.

The polymeric binders, therefore, exhibit various structural elements for satisfying the extensive requirements, which may have different effects on individual properties. For instance, hydrophilic structural elements such as carboxyl groups, hydroxyl groups and the like generally promote the developability of the photosensitive compositions in aqueous alkaline developers and partly ensure sufficient adhesion to polar substrates. Hydrophobic structural elements, on the other hand, reduce the capability of being developed in the above-mentioned developers, but ensure the good ink receptivity used in the printing process, which is indispensable in lithographic plates.

Due to the broad range of requirements regarding the polymeric binders, there have been extensive studies for many years on the synthesis and optimization of the use of these substances for photosensitive compositions, cf. e.g. H. Baumann and H.-J. Timpe: "Chemical Aspects of Offset Printing" in *J. prakt. Chem./Chemiker-Zeitung* [Journal for chemists] 336 (1994) pages 377–389.

Negative photosensitive compositions for lithographic plates can be divided into the following two main groups:
a) Systems where the binder forms a network together with a photosensitive component due to exposure to light. Such photosensitive components are e.g. diazo resins; reactive photolysis products thereof react for example with OH groups of the binder. A disadvantage of these systems is their low print run stability.
b) Systems containing binders with photoreactive groups, which can be crosslinked by exposure to light (in many cases by the additional use of a sensitizer). These systems allow the production of plates with high print run stability.

The following applications and patents deal with systems of item b) above: U.S. Pat. No. 2,690,966 discloses cinnamic acid esters of polyvinyl alcohol useful in photomechanical resist compositions. GB-B-1274017 describes lithographic printing plates comprising a layer containing polyvinylacetal; the polyvinylacetal contains at least 10 wt.-% polyvinyl alcohol units which are partially esterified with cinnamic acid. These printing plates are, however, only developable with developers having a high solvent content which is disadvantageous for environmental reasons.

In U.S. Pat. No. 2,861,058 radiation-sensitive polymers are claimed where polyvinylalcohol is esterified with cinnamic acid and further acids and contains free carboxyl groups in the side chain of the polymer. Printing plate precursors comprising such a polymer are, however, insufficient in photospeed.

In EP-A-0 092 901 polyvinyl acetals modified by chalcon groups are claimed. The length of run of plates made with these polymers and the photospeed are, however, insufficient nowadays.

U.S. Pat. No. 3,030,208 and U.S. Pat. No. 3,622,320 disclose polymers which contain cinnamoyl groups in the main chain of polyester resins. The developing of radiation-sensitive elements containing such polymers requires the use of developers with high solvent content; furthermore, there is a high tendency to form sludge in the developing machine.

In U.S. Pat. No. 3,929,489, and U.S. Pat. No. 4,419,437 polymers are claimed which contain cinnamoyl groups in the main chain of polyester resins and further contain disulfone amino groups. The developability and length of run of plates obtained therewith, however, do not meet the high requirements nowadays.

In U.S. Pat. No. 2,787,546 acetal polymers are disclosed containing in one side chain both cinnamate and carboxylic group functionalities. However, plates comprising such polymers suffer from the disadvantage of insufficient photospeed.

SUMMARY OF THE INVENTION

It is thus the object of the present invention to provide polymers for radiation-sensitive compositions which, in addition to their high photospeed and resolution, ensure a high durability on the press and also a low tendency to form sludge in the developing processor during developing and which, furthermore, do not require developers with a high content of organic solvents.

These objects are achieved by means of the cinnamic acid groups containing acetal polymers comprising units A–D and optionally E, wherein A is present in an amount of about 25 to 55 mol % and is of the formula

B is present in an amount of about 0.5 to 25 mol % and is of the formula

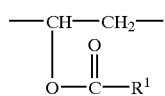
(B)

wherein $R^1$ is selected from the group consisting of alkyl, aryl and aralkyl,

C is present in an amount of about 0.5 to 40 mol % and is of the formula

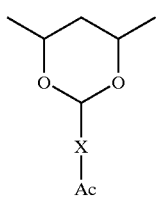
(C)

wherein X is an aliphatic or aromatic spacer group, and Ac is an acidic group selected from the group consisting of —COOH, —$SO_3H$ or —$SO_2NR^9R^{10}$ with $R^9$ and $R^{10}$ independently being selected from hydrogen and alkyl; and when X is phenylene, Ac can also be OH, D is present in an amount of about 20 to 70 mol % and is of the formula

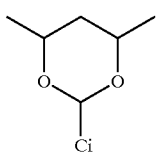
(D)

wherein Ci is selected from the group consisting of Ci-1, Ci-2, Ci-3 and Ci-4 which are represented by the following formulae

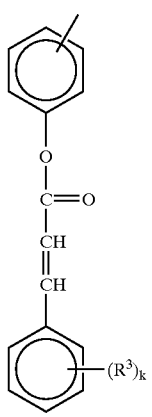
(Ci-1)

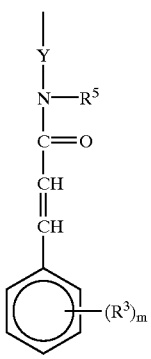
(Ci-2)

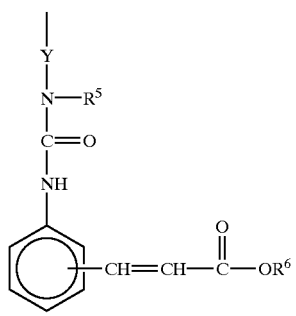
(Ci-3)

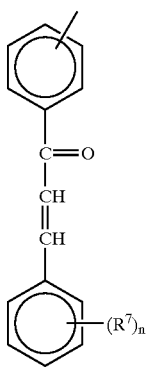
(Ci-4)

wherein:

k, m and n are integers independently selected from 0 to 5, $R^3$, $R^4$ and $R^7$ are independently selected from the group consisting of alkyl, alkoxy, —$COOR^8$, —$NR^9R^{10}$, —NH—CO—$CH_3$, halogen and cyano, $R^8$ is selected from hydrogen and alkyl;

$R^9$ and $R^{10}$ are independently selected from hydrogen and alkyl, $R^5$ is selected from the group consisting of hydrogen, alkyl, aryl and aralkyl;

$R^6$ is selected from the group consisting of alkyl, aryl and aralkyl and

Y is selected from the group consisting of alkylene, arylene and arylenealkylene; and E is present in an amount of about 0 to 50 mol % and is of the formula

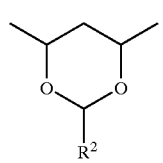

(E)

wherein R² is selected from the group consisting of alkyl, aryl and aralkyl groups.

DETAILED DESCRIPTION OF THE INVENTION

The present invention relates to photosensitive compositions comprising:
(i) a polymeric binder and
(ii) optionally at least one other component selected from the group consisting of photosensitizers for photocyclo addition, diazo resins, colorants, exposure indicators, surfactants, stabilizing acids and plasticizers characterized in that the binder comprises units A, B, C, D and optionally E wherein A is present in an amount of about 25 to 55 mol % and is of the formula

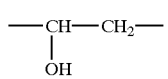

(A)

B is present in an amount of about 0.5 to 25 mol % and is of the formula

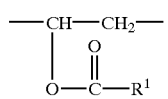

(B)

wherein $R^1$ is selected from the group consisting of alkyl, aryl and aralkyl
C is present in an amount of about 0.5 to 40 mol % and is of the formula

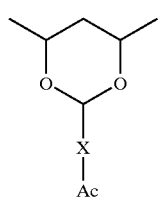

(C)

wherein X is an aliphatic or aromatic spacer group, and Ac is an acidic group selected from the group consisting of —COOH, —SO₃H or —SO₂NR⁹R¹⁰ with $R^9$ and $R^{10}$ independently being selected from hydrogen and alkyl; and when X is phenylene, Ac can also be OH,
D is present in an amount of about 20 to 70 mol % and is of the formula

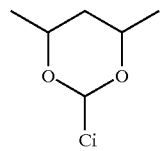

(D)

wherein Ci is selected from the group consisting of Ci-1, Ci-2, Ci-3 and Ci-4 which are represented by the following formulae

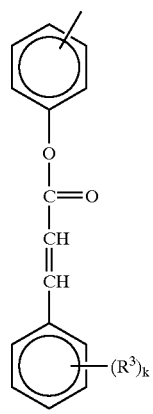

(Ci-1)

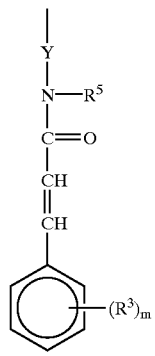

(Ci-2)

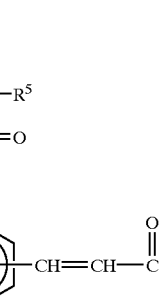

(Ci-3)

-continued

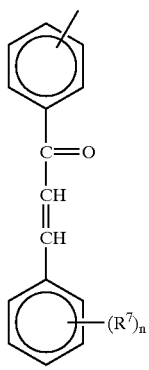

(Ci-4)

wherein:
k, m and n are integers independently selected from 0 to 5, $R^3$, $R^4$ and $R^7$ are independently selected from the group consisting of alkyl, alkoxy, —COOR$^8$; —NR$^9$R$^{10}$, —NH—CO—CH$_3$, halogen and cyano;
$R^8$ is selected from hydrogen and alkyl;
$R^9$ and $R^{10}$ are independently selected from hydrogen and alkyl;
$R^5$ is selected from the group consisting of hydrogen, alkyl, aryl and aralkyl;
$R^6$ is selected from the group consisting of alkyl, aryl and aralkyl and
Y is selected from the group consisting of alkylene, arylene and arylenealkylene, and
E is present in an amount of about 0 to 50 mol % and is of the formula

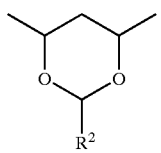

(E)

wherein $R^2$ is selected from alkyl, aryl and aralkyl groups.

Unless defined otherwise, within this disclosure the terms "alkyl", "alkylene", "halogen", "aryl", "arylene", "aralkyl", "arylenealkylene" and "alkoxy" have the following meanings:
The term "alkyl" as used herein includes straight chain alkyl groups and branched chain alkyl groups; preferably the alkyl group consists of 1 to 8 carbon atoms, more preferably 1 to 4 carbon atoms. The alkyl groups can be unsubstituted or substituted with at least one substituent like OH and halogen.
As used herein the term "halogen" or "halo" includes fluorine, chlorine, bromine and iodine atoms.
The term "alkoxy" includes straight chain alkoxy groups as well as alkoxy groups wherein the alkyl moiety is a branched chain alkyl moiety; preferably the alkoxy group has 1 to 8 carbon atoms, more preferably 1 to 4 carbon atoms.
The term "aryl" includes unsubstituted aryl groups and aryl groups having 1 to 3 substituents selected from the group consisting of halogens, alkyl, alkoxy, acyl, amino group, cyanide group and nitro group; preferably an aryl group consists of 6 to 14 carbon atoms in the aryl moiety (i.e. without optional substituted), more preferably the aryl group is substituted or unsubstituted phenyl or naphthyl, especially preferred unsubstituted phenyl or naphthyl. The term "aryl" also includes 5- and 6-membered heterocyclic aryl groups.

The term "aralkyl" refers to a group having an aryl moiety as defined above and an alkyl moiety as defined above.

The term "arylenealkylene" refers to a divalent "aralkyl" group wherein the aryl and alkyl moieties are as defined above.

The term "alkylene" refers to a divalent "alkyl" group wherein the alkyl moiety is as defined above. The term "arylene" refers to a divalent "aryl" group wherein the aryl moiety is as defined above.

Unit A is present in the copolymer of the present invention in an amount of about 25 to 55 mol %, preferably about 30 to 40 mol %.

Unit B amounts to about 0.5 to 25 mol % in the copolymer of the present invention, preferably about 2 to 15 mol %. $R^1$ is selected from the group consisting of alkyl, aryl and aralkyl; especially preferred $R^1$ is alkyl, most preferred methyl. Unit B can be present several times in the copolymer with various moieties $R^1$ independent of one another.

The copolymer of the present invention contains about 0.5 to 40 mol % of unit C, preferably about 2 to 20 mol %. In formula (C) X is an aliphatic or aromatic spacer group, preferably $C_1$–$C_8$ alkylene or $C_6$–$C_{14}$ arylene, which can be substituted as defined above for "alkyl" and "aryl". Especially preferred X is arylene and most preferred 1,4-phenylene. Ac is selected from the group consisting of —COOH, —SO$_3$H and —SO$_2$NR$^{910}$ ($R^9$ and $R^{10}$ are independently selected from hydrogen and alkyl), preferably —COOH and —SO$_2$NR$^9$R$^{10}$, most preferred —COOH; if X is phenylene Ac can also be OH.

Unit C can be present several times in the copolymer with various moieties X and Ac independent of one another.

Unit D is present in the copolymer of the present invention in an amount of about 20 to 70 mol %, preferably about 50 to 60 mol %. Ci is selected from Ci-1, Ci-2, Ci-3 and Ci-4 represented by the following formulae

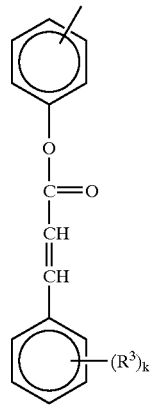

(Ci-1)

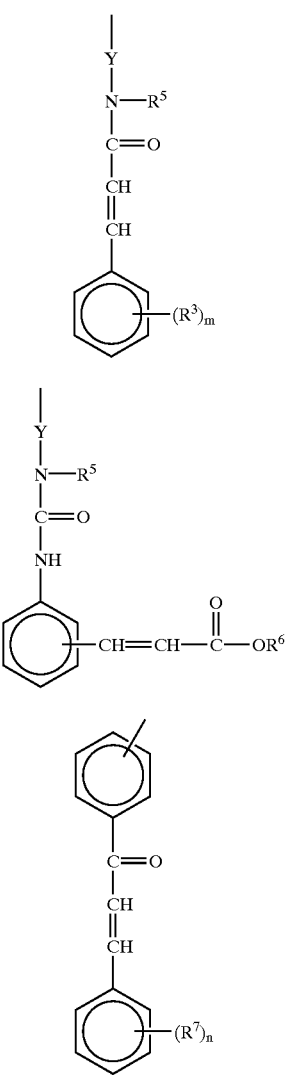

k, m and n are integers independently selected from 0 to 5, preferably 0 to 3, most preferred 0 and 1.

$R^5$ is selected from the group consisting of hydrogen, alkyl, aryl and aralkyl, preferably alkyl, most preferred methyl. $R^3$, $R^4$ and $R^7$ are independently selected from the group consisting of alkoxy, alkyl, —COOR$^8$, —NR$^9$R$^{10}$, halogen, cyano and —NH—CO—CH$_3$, with $R^8$, $R^9$ and $R^{10}$ being independently selected from hydrogen and alkyl (preferably alkyl); preferably $R^3$, $R^4$ and $R^7$ are selected from the group consisting of alkyl and alkoxy.

Y is selected from the group consisting of alkylene, arylene and arylenealkylene (the aryl or the alkyl moiety thereof can be bonded to

), preferably alkylene, most preferred —(CH$_2$)$_z$— with z being an integer selected from the group consisting of 1, 2 and 3.

$R^6$ is selected from the group consisting of alkyl, aryl and aralkyl, preferably alkyl. The copolymer of the present invention contains at least one kind of formulae Ci-1, Ci-2, Ci-3 and Ci-4. Furthermore, each moiety of Ci-1, Ci-2, Ci-3 and Ci-4 can be present several times in a copolymer with various $R^3$ to $R^7$ independent of one another. The particularly preferred Ci group is Ci-1 with k=0.

Optionally the copolymer of the present invention further contains unit E in an amount of up to 50 mol %; it is however preferred that the copolymer does not contain unit E. If unit E is present in the copolymer it can be present in an amount of about 1 to 25 mol % and furthermore, can be present several times with various $R^2$ independent of one another. $R^2$ is selected from the group consisting of alkyl, aryl and aralkyl; preferably it is selected from the group consisting of $C_1$–$C_5$ alkyl.

The vinyl alcohol/vinyl acetate copolymers that serve as starting material for the preparation of the polymers of the present invention are 70 to 98 mol % hydrolyzed and have a weight-average molecular mass $M_w$ of 20,000 to 130,000 g/mol. Suitable copolymers of this type are commercially available. Which copolymer is used as starting material for the synthesis depends on the intended use of the photosensitive composition. If offset lithographic plates are to be produced, polymers with a weight-average molecular mass $M_w$ of 35,000 to 130,000 g/mol and an hydrolysis degree of the vinyl acetate structural unit of 80 to 98 mol % are preferably used.

The preparation of the copolymers of the present invention takes place in two synthesis steps. In a first step, monomeric aldehydes/acetals containing a cinnamoyl group are prepared which in a subsequent second step are reacted with polyvinyl alcohol to obtain the polyvinyl acetals containing cinnamoyl groups in the side chains. The two steps may be carried out sequentially with or without isolating the aldehydes/acetals.

For obtaining a polyvinyl acetal with unit D being Ci-1 the following aldehyde (I) has to be prepared in the first step

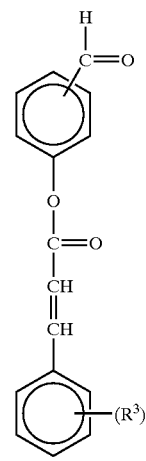

wherein $R^3$ and k are as defined above.

Aldehyde (I) can be obtained by reacting hydroxybenzaldehyde with the corresponding cinnamoyl chloride in the presence of an amine catalyst. For obtaining a polyvinyl acetal with unit D being Ci-2 the following acetal (II) has to be prepared in the first step

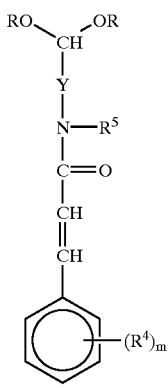

(II)

wherein R is alkyl, and m, Y, $R^4$ and $R^5$ are as defined above.

Acetal (II) can be obtained by reacting the corresponding cinnamoyl chloride with the corresponding amino substituted aldehyde dialkyl acetal.

For obtaining a polyvinyl acetal with unit D being Ci-3 the following acetal III has to be prepared in the first step

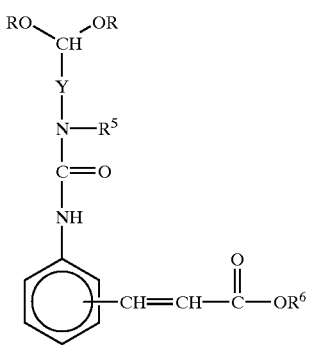

(III)

wherein R, $R^5$ and $R^6$ are as defined above.

Acetal (III) can be obtained by reacting the corresponding isocyanatocinnamic acid ester with the corresponding amino substituted aldehyde dialkyl acetal.

For obtaining a polyvinyl acetal with unit D being Ci-4 the following aldehyde (IV) has to be prepared in the first step

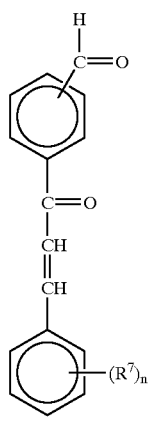

(IV)

wherein n and $R^7$ are as defined above.

Aldehyde (IV) can be obtained by acylation of benzaldehyde with the corresponding cinnamoyl chloride.

When preparing the binders of the present invention in organic solvents or hydroxyl-group containing solvent/water mixtures, the end products are precipitated by stirring them into water. The precipitation procedure may also take place such that water is stirred into the reaction mixture. In both cases, the mixture must be intensely mixed in order to obtain a reaction product easy to handle and to separate the side products that also form as quantitatively as possible. In reactions in water, the product will precipitate in the course of the reaction. In both cases, the precipitated reaction product is separated, washed with water and then dried using hot air of 45 to 50° C. until the water content is reduced to no more than 3 wt.-%.

In the radiation-sensitive composition of the present invention the copolymer containing units A–D and A–E, respectively, as defined above is preferably present in an amount of about 10 to 95 wt.-% based on the solid content of the composition, more preferably about 30 to 85 wt.-%.

The radiation-sensitive composition of the present invention can further contain a photo-sensitizer for photocyclo addition. The use of a photosensitizer can be advantageous if the wavelength used for imaging the radiation-sensitive element of the present invention is outside the wavelength range where the cinnamate absorbs. All sensitizers enabling a photocyclo addition known in the field of the art may be used. Examples are, for instance, the sensitizers mentioned in DE-A-26 26 769, DE-42 31 324 and U.S. Pat. No. 5,476,754 such as xanthones, thioxanthones, aceto phenone, benzaldehyde, carbazole, triphenyl amine, hexachloro benzene, 4,4-diphenyl cyclohexadienone, 1,2-dibenzoyl benzene, benzophenone and derivatives thereof, 1,4-diacetyl benzene, fluorene, anthrone, benzanthrone and derivatives thereof, 2-nitrofluorene, quinoxaline, 4-nitrobiphenyl, 4-cyano benzophenone, thioxanthone (also alkyl or halo substituted), phenyl glyoxal, anthraquinone, quinoline, phenantrene, flavone, Michler's ketone, 4-acetyl diphenyl, 2-acetonaphthene, acridine yellow, 1-naphthyl phenyl ketone, chrysene, 1-acetonaphthol, 1-naphthaldehyde, coronene, benzil, fluorenone, fluorescein (acid), aromatic nitro compounds such as p-nitrostilbene, 5-nitro acenaphthene and 4-nitroaniline, naphthothiazoline and derivatives thereof, 1-acetylamino-4-nitronaphthaline, quinones, benzo thiazoline derivatives, naphtho thiazole derivatives, ketocumarin derivatives, benzothiazole derivatives, naphthofuranone compounds, benzothiazolines, pyrylium salts and thiapyrylium salts.

Particularly preferred are ketocumarins, thioxanthones and benzophenones; especially preferred thereof are isopropyl thioxanthone, chlorothioxanthene and Michler's ketone.

The weight portion of the sensitizers is preferably about 0.5 to 20 wt.-% based on the solid content of the photosensitive composition, more preferably about 1 to 15 wt.-% and most preferably about 1 to 10 wt.-%.

The radiation-sensitive composition of the present invention can further comprise at least one other additive selected from the group consisting of colorants, exposure indicators, stabilizing acids, plasticizers and surfactants. The total amount of these additives is preferably about 0.25 to 25 wt.-% based on the solid content of the radiation-sensitive composition, more preferably about 1 to 20 wt.-%.

Suitable colorants are those that dissolve well in the solvent or solvent mixture used for coating or are easily introduced as a pigment in the disperse form; they include inter alia rhodamin dyes, methyl violet, anthraquinone pigments and phthalocyanine dyes and/or pigments. The dyes and/or pigments may be comprised in the photosensitive composition in an amount of about 1 to 15 wt.-%, more preferably about 2 to 7 wt.-%.

Furthermore, the composition of this invention may comprise stabilizing acids. These acids include phosphoric, citric, benzoic, 4-toluene sulfonic and tartaric acid. In some formulations, a mixture of several different acids is advantageous. 4-toluene sulfonic acid is preferably used as acid. The added acid preferably amounts to about 0.2 to 3 wt.-%.

Furthermore, the photosensitive composition of this invention may comprise more components, such as plasticizers. Suitable plasticizers include dibutyl phthalate, triaryl phosphate and dioctyl phthalate. Dioctyl phthalate is especially preferred. The amount of plasticizer used is preferably about 0.25 to 2 wt.-%.

The composition of this invention may also comprise exposure indicators which indicate exposure to radiation by changing their color. Suitable exposure indicators are for instance metanil yellow and 4-phenylamino azo benzene. The indicators are preferably used in an amount of about 0.3 to 5 wt.-%.

Also diazo resins usually used in negative working radiation-sensitive compositions may be present in the photosensitive compositions of the present invention. If present, their amount is preferably about 1 to 50 wt.-% based on the solid content of the composition, more preferably about 1 to 40 wt.-%.

The diazo resin is a condensation product of a monomeric diazonium compound and a second partner. Such condensation products may for instance be prepared in a common manner by condensation of a diazo monomer such as 4-diazo-diphenylamine, 1-diazo-4-N,N-dimethylamniobenzene, 1-diazo-4-N,N-diethylaminobenzene, 1-diazo-4-N-ethyl-N-hydroxyethylaminobenzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-N,N-dimethylaminobenzene, 1-diazo-4-morpholinobenzene, 1-diazo-2,5-dimethoxy-4-p-tolylmercaptobenzene, 1-diazo-2-ethoxy-4-N,N-dimethylaminobenzene, p-diazo-dimethylaniline, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-morpholinobenzene, 1-diazo-2,5-diethoxy-4-p-tolylmercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-4-diazodiphenylamine, 3-ethoxy-4-diazodiphenylamine, 3-(n-propoxy)-4-diazodiphenylamine or 3-(isopropoxy)-4-diazodiphenylamine with a condensation agent, such as aliphatic aldehydes (preferred are formaldehyde, acetaldehyde, propionaldehyde and butyraldehyde), benzaldehyde or condensable aromatic compounds, in particular from phenol ethers, such as 4,4'-bis-methoxymethyl diphenyl ether. Especially advantageous examples of diazonium polycondensation products are reaction products of diphenylamine-4-diazonium salts, optionally having a methoxy group in the phenyl group bearing the diazo group. Aromatic sulfonates (such as 4-tolylsulfonate or mesitylene sulfonate) or dihydrogenphosphate are particularly suitable as anions of these diazo resins. Preferably the diazo resin is the condensation product of formaldehyde with diphenylamine-4-diazonium salt, more preferably said condensation product was isolated as organic sulfonate.

Instead of incorporating a diazo resin into the radiation-sensitive composition it is also possible to prepare a radiation-sensitive element by applying between substrate and radiation-sensitive layer a separate layer comprising a diazo resin. If the diazo resin is used as a subcoat it is preferred to use a condensation product of 3-methoxy-diphenylamine-4-diazonium sulfate and 4,4'-bis-methoxymethyldiphenyl ether preferably precipitated from an aqueous solution as dihydrogen phosphate.

Dependent on the substrate to be used for the preparation of the radiation-sensitive element the diazo resin is incorporated into the radiation-sensitive layer or applied as a separate subcoat. It is well known to a person skilled in the art that the adherence of a radiation-sensitive layer on a substrate depends on the kind of substrate especially the kind of pretreatment of the substrate; it is commonly known that the adherence to particular substrates can be improved by the presence of a diazo resin in the radiation-sensitive layer or as a subcoat. In some cases the use of a separate subcoat instead of incorporating the diazo resin into the radiation-sensitive layer improves the shelf life of the radiation-sensitive element.

Furthermore, the diazo resin can be present both in a radiation-sensitive element as a subcoat and as a component of the radiation-sensitive composition.

The radiation-sensitive compositions of the present invention are preferably usable for producing lithographic plates. In addition, however, they may be used in recording materials for creating images on suitable carriers and receiving sheets, for creating reliefs that may serve as printing molds, screens and the like, as light-hardening varnishes for surface protection and for the formulation of UV-hardening printing inks.

For the preparation of lithographic printing plates, aluminum as the carrier is first grained by brushing in a dry state, brushing with abrasive suspensions or electrochemically, e.g. in a hydrochloric acid electrolyte. The grained plates, which were optionally anodically oxidized in sulfuric or phosphoric acid, are then subjected to hydrophilizing after treatment, preferably in aqueous solutions of polyvinyl phosphonic acid, sodium silicate or phosphoric acid. The details of the above-mentioned substrate pretreatment are well-known to the person skilled in the art.

The subsequently dried plates are coated with the radiation-sensitive compositions out of organic solvents and/or solvent mixtures in such a way that dry layer weights of preferably from 0.5 to 4 $g/m^2$, more preferably from 0.8 to 3 $g/m^2$ are obtained.

In few cases, the additional application of an oxygen-impermeable top layer to the photosensitive layer may be advantageous. The polymers suitable for the top layer include polyvinyl alcohol, polyvinyl alcohol/polyvinyl acetate copolymers, polyvinyl pyrrolidone, polyvinyl pyrrolidone/ polyvinyl acetate copolymers and gelatin. The layer weight of the oxygen-impermeable top layer is preferably 0.1 to 4 $g/m^2$, and more preferably 0.3 to 2 $g/m^2$. However, the lithographic plates produced using the photosensitive compositions of the present invention do have excellent properties even with no top layer.

The thus obtained lithographic plates are exposed and developed as known to the person skilled in the art. The developed plates are usually treated with a preservative ("rubber coating"). The preservatives are aqueous solutions of hydrophilic polymers, wetting agents and other additives.

For certain uses it is furthermore advantageous to increase the mechanical strength of the printing layers by means of a heat treatment or a combined use of heat and UV radiation. For this purpose, the plate is first treated with a solution that protects the non-image areas such that the heat treatment will cause no ink receptivity in these areas. A suitable solution is described e.g. in U.S. Pat. No. 4,355,096. However, the lithographic plates produced using the photosensitive compositions of the present invention do have excellent properties even with no heat treatment.

The following examples serve to provide a more detailed explanation of the invention but is not intended to be limited thereby.

EXAMPLES

Preparation Example 1
(Precursor to Make the Light Sensitive Polymer of Preparation Example 2)

10 g of 3-isocyanato cinnamic acid ethylester were dissolved in 50 ml methyl ethyl ketone. At room temperature a solution of 5.49 g of 2-methylaminoacetaldehyde dimethylacetal in 20 ml methyl ethyl ketone were added under stirring. The mixture was stirred for 3 hours at 70° C. in a three-necked flask equipped with cooler, stirrer and thermometer. After distilling off the methyl ethyl ketone in a vacuum rotary evaporator 15.2 g of a yellow brownish oily liquid was obtained showing no isocyanate band in the infrared spectrum.

Preparation Example 2

6.4 g Mowiol 8/88® and 1.6 g Mowiol 5/88® (polyvinyl alcohols available from Clariant having a content of residual acetyl groups of approx. 21 wt.%) were dissolved in 70 ml dimethylsulfoxide at 60° C. in a three-necked flask equipped with cooler, stirrer and thermometer in a water bath. 0.8 ml of hydrochloric acid were added followed by a drop-wise addition of 12.6 g of the reaction product of 3-isocyanato cinnamic acid ethylester with 2-methylaminoacetaldehyde dimethylacetal (from Preparation Example 1) dissolved in 5 ml dimethylsulfoxide. The mixture was stirred for 2 hours at 60° C. and a solution of 2.2 g 4-carboxybenzaldehyde dissolved in 5 ml dimethylsulfoxide was added. After stirring for 16 hours at 60° C. the solution was diluted with 70 ml dimethylsulfoxide and poured slowly into an excess of water. The precipitate was washed several times with water, filtered and dried in a rotary drying chamber for 24 hours at 40° C. The analytical examination of the product revealed an acid number of 50 mg KOH per gram polymer.

Preparation Example 3
(Precursor to Make the Light Sensitive Polymer of Preparation Example 4)

50 g of 4-hydroxy benzaldehyde were dissolved in 250 ml methyl ethyl ketone in a three-necked flask equipped with cooler, stirrer and thermometer. At room temperature 68.2 g of cinnamic acid chloride followed by 43.5 g triethylamine were added under stirring. Then the mixture was refluxed for 5 hours. After filtering off the precipitated triethylamine hydrochloride the methyl ethyl ketone was distilled off in a vacuum rotary evaporator. 76.5 g of a yellowish waxy product was obtained.

Preparation Example 4

52.8 g Mowiol 8/88® and 13.2 g Mowiol 5/880 (polyvinyl alcohols available from Clariant having a content of residual acetyl groups of approx. 21 wt.%) were dissolved in 570 ml dimethylsulfoxide at 60° C. in a three-necked flask equipped with cooler, stirrer and thermometer in a water bath. After adding 6.6 ml of concentrated hydrochloric acid a solution of 50.6 g of the reaction product of cinnamic acid chloride and 4-hydroxy benzaldehyde (Preparation example 3) in 20 ml dimethylsufoxide was added drop-wise. The solution was stirred at 60° C. for 4 hours before 35.2 g 4-carboxybenzaldehyde dissolved in 44 ml dimethylsulfoxide were added. The mixture was stirred at 60° C. for another 16 hours, diluted with 640 ml dimethylsulfoxide and poured slowly into an excess of water. The precipitate was washed several times with water, filtered and dried in a rotary drying chamber for 24 hours at 40° C. The analytical examination of the product revealed an acid number of 94 mg KOH per gram polymer.

Example 1

A coating solution was prepared from the following components:

2.19 g polymer of Preparation Example 2

0.025 g 4-phenyl-azo-diphenylamine 0.035 g phosphoric acid 2 g polycondensation product from 1 mole 3-methoxy diphenylamine-4-diazonium sulfate and 1 mole 4,4'-bis-methoxymethyldiphenyl ether precipitated as mesitylene sulfonate 5.44 g of a 13.8 wt-% dispersion in 3-methoxy-1-propanol, solid comprising 1 part of the polymer of preparation example 2 and 1 part of Irgalith blue GLG (Cu-phthalocyanine C.I.15:3, available from Ciba-Geigy)

These components were dissolved under stirring in 100 ml of a mixture comprising 30 parts by volume methyl glycol 45 parts by volume methanol 25 parts by volume methyl ethyl ketone.

After filtering the solution, it was applied to an electrochemically roughened and anodized aluminum foil that had been subjected to an aftertreatment using an aqueous solution of polyvinyl phosphonic acid by means of common methods and the coating was dried for 4 minutes at 90° C. The weight of the printing layer amounted to approx. 1 g/m$^2$.

The printing layer was exposed with an exposure energy of 600 mJ/cm$^2$ under a silver film halftone step wedge having a tonal range of 0.15 to 1.95, wherein the density increments amount to 0.15, to give a negative model using a metal halogenide lamp (MH burner, available from W. Sack). The exposed coating was treated for 30 seconds with a developer solution comprising 3.4 parts by weight Rewopol NLS 28® (available from REWO)

1.1 parts by weight diethanol amine 1.0 parts by weight Texapon 842® (available from Henkel)

0.6 parts by weight Nekal BX Paste® (available from BASF)

0.2 parts by weight 4-toluene sulfonic acid 93.7 parts by weight water.

Then the developer solution was again rubbed over the surface for another 30 seconds using a tampon and then the entire plate was rinsed with water. After this treatment the exposed portions remained on the plate. For the assessment of its photosensitivity, the plate was blackened in a wet state using a printing ink. The plate's ink receptivity was good and exposed microscopic lines were very well reproduced. The gray wedge was completely covered up to step 3 and partially covered up to step 7.

For the preparation of a lithographic plate a printing layer was applied to the aluminum foil, as explained above, exposed, developed and after rinsing with water the developed plate was wiped and rubbed with an aqueous solution of 0.5% phosphoric acid and 6% gum arabic. The thus prepared plate was loaded in a sheet-fed offset printing machine and provided 90,000 copies of good quality using abrasive ink (Offset S 7184 available from Sun Chemical which contain 10% of potassium carbonate).

Example 2

A coating solution was prepared from the following components:

2.47 g binder polymer of Preparation Example 4

0.025 g 4-phenyl-azo-diphenylamine 0.035 g phosphoric acid 1.5 g polycondensation product from 1 mole diphenylamine-4-diazonium sulfate and 1 mole formaldehyde precipitated as p-toluene sulfonate 5.44 g of a 13.8 wt-% dispersion in 3-methoxy-1-propanol, solid comprising 1 part of the polymer of Preparation Example 4 and 1 part of Irgalith blue GLG (Cu-phthalocyanine C.I.15:3, available from Ciba-Geigy)

These components were dissolved under stirring in 100 ml of a mixture comprising 30 parts by volume methyl glycol 45 parts by volume methanol 25 parts by volume methyl ethyl ketone.

The coating solution was applied to an electrochemically roughened and anodized aluminum foil that had been subjected to an aftertreatment using an aqueous solution of polyvinyl phosphonic acid by means of common methods and the plate was dried for 5 minutes at 92° C. The coating weight of the printing layer was approx. 1.0 g/m².

The printing layer was exposed with an exposure energy of 300 mJ/cm² under a silver film halftone step wedge having a tonal range of 0.15 to 1.95, wherein the density increments amounted to 0.15, to give a negative model using a metal halogenide lamp (MH burner, available from W. Sack). The exposed coating was treated for 30 seconds with a developer solution comprising 3.4 parts by weight Rewopol NLS 28® (available from REWO)

1.8 parts by weight 2-phenoxy ethanol 1.1 parts by weight diethanol amine 1.0 parts by weight Texapon 842® (available from Henkel)

0.6 parts by weight Nekal BX Paste® (available from BASF)

0.2 parts by weight 4-toluene sulfonic acid 91.9 parts by weight water.

Then the developer solution was again rubbed over the surface for another 30 seconds using a tampon and then the entire plate was rinsed with water. After this treatment the exposed portions remained on the plate. For the assessment of its photosensitivity, the plate was blackened in a wet state using a printing ink. The plate's ink receptivity was good and exposed microscopic lines were very well reproduced. The gray wedge was completely covered up to step 3 and partially covered up to step 7. Non image areas could be removed within 5 seconds with the developer described above.

A press test was performed as described in Example 1 and the plate provided 170,000 copies of good quality.

Comparative Example 1 (ref. U.S. Pat. No. 2,690, 966)

A coating solution was prepared from the following components:

2.19 g of the ester of cinnamic acid and PVA described in U.S. Pat. No. 2,690,966

0.025 g 4-phenyl-azo-diphenylamine 0.035 g phosphoric acid.

2 g polycondensation product from 1 mole 3-methoxy diphenylamine-4-diazonium sulfate and 1 mole 4,4'-bis-methoxymethyldiphenyl ether precipitated as mesitylene sulfonate 5.44 g of a 13.8 wt-% dispersion in 3-methoxy-1-propanol, solid comprising 1 part of the ester of cinnamic acid and PVA described in U.S. Pat. No. 2,690, 966 and 1 part of Irgalith blue GLG (Cu-phthalocyanine C.I.15:3, available from Ciba-Geigy)

These components were dissolved under stirring in 100 ml of a mixture comprising 30 parts by volume methyl glycol 45 parts by volume methanol 25 parts by volume methyl ethyl ketone.

After filtering the solution, it was applied to an electrochemically roughened and anodized aluminum foil that was subjected to an aftertreatment using an aqueous solution of polyvinyl phosphonic acid by means of common methods and the coating was dried for 4 minutes at 90° C. The weight of the printing layer amounted to approx. 1 g/m².

The thus prepared plates proved to be very hard to develop. The unexposed portions of the coating were partially insoluble in the developer and tended to form deposits on the plate. The resolution was poor since the spaces between fine details were not developed properly.

Comparative Example 2 (According to EP-B-0 092 901)

A coating solution was prepared corresponding to example 6 of EP-B-0 092 901; a copolymer was prepared from the following components: polyvinyl alcohol and 4-(2, 2-diethoxy)-ethoxy-4¹-sulphochalcone.

After filtering the solution, it was applied to an electrochemically roughened and anodized aluminum foil that had been subjected to an after treatment using an aqueous solution of polyvinyl phosphonic acid by means of common methods and the coating was dried for 4 minutes at 90° C. The weight of the printing layer amounted to approx. 1 g/m².

The thus prepared plate was exposed and developed as described in Example 1.

A press test was performed as described in Example 1 but after 100 copies the plate exhibited an enormous loss of micro-elements and beginning wear of the solids.

Comparative Example 3 (ref. U.S. Pat. No. 3,622, 320)

A coating solution was prepared from the following components:

| | | |
|---|---|---|
| 3.6 g | Hectec | Light sensitive polyester from KODAK[1] |
| 0.17 g | BFT | 2-[Bis(2-furanyl)methylene]-1-methylnaphtho[1,2-d] thiazoline |
| 0.055 g | LPV | Leuco propyl violet |
| 0.29 g | 4Cl-BSN | N-(4-Chlorobenzenesulfonyloxy)-1,8-naphthalimide |
| 0.0055 g | Daphr | Dihydranhydropiperidinohexose reductone |
| 0.12 g | BHT | 2,6-Di-t.butyl-p-cresol |
| 0.76 g | Red pigment | Monastral Red pigment |

1) 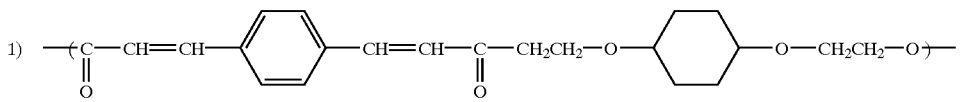

These components were dissolved under stirring in 100 ml of a mixture comprising
- 55 parts by volume toluene
- 28 parts by volume methyl ethyl ketone
- 17 parts by volume propylenglycolmonomethylether After filtering the solution, it was applied to an electrochemically roughened and anodized aluminum foil that had been subjected to an after treatment using an aqueous solution of polyvinyl phosphonic acid by means of common methods and the coating was dried for 5 minutes at 92° C. The weight of the printing layer amounted to approx. 1 g/m².

The thus prepared plate was exposed and developed as described in Example 1. Even though the plates were rubbed strongly with developer to remove the coating in the unexposed areas the background of the plate was not totally clean and scumming was observed during printing.

Comparative Example 4 (According to U.S. Pat. No. 2,861,058)

A coating solution was prepared from the following components:
- 2.47 g binder polymer of Example 1 of U.S. Pat. No. 2,861,058 (polyvinyl cinnamate/phthalate with 43 mol % cinnamate and 41 mol % phthalate)
- 0.025 g 4-phenyl-azo-diphenylamine
- 0.035 g phosphoric acid
- 1.5 g polycondensation product from 1 mole diphenylamine-4-diazonium sulfate and 1 mole formaldehyde precipitated as p-toluene sulfonate
- 5.44 g of a 13.8 wt-% dispersion in 3-methoxy-1-propanol, solid comprising 1 part of the polymer of Example 2 of U.S. Pat. No. 2,861,058 (polyvinyl cinnamate/phthalate with 43 mol % cinnamate and 41 mol % phthalate) and 1 part of Irgalith blue GLG (Cu-phthalocyanine C.I.15:3, available from Ciba-Geigy)

These components were dissolved under stirring in 100 ml of a mixture comprising
- 30 parts by volume methyl glycol
- 45 parts by volume methanol
- 25 parts by volume methyl ethyl ketone.

The coating solution was applied to an electrochemically roughened and anodized aluminum foil that had been subjected to an aftertreatment using an aqueous solution of polyvinyl phosphonic acid by means of common methods and the plate was dried for 5 minutes at 92° C. The coating weight of the printing layer was approx. 1.0 g/m².

The plate was exposed and developed as described in Example 2. The gray wedge was completely covered only on step 1 and partially covered only up to step 3.

A press test was performed as described in Example 1 and plate wear was observed after 35,000 copies.

Comparative Example 5 (ref. U.S. Pat. No. 2,787,546)

A coating solution was prepared from the following components:
- 2.47 g binder polymer of Example 1 of U.S. Pat. No. 2,787,546 (polymer obtained by reaction of polyvinyl acetate and monoterephthalal-p-methoxyacetophenone)
- 0.025 g 4-phenyl-azo-diphenylamine
- 0.035 g phosphoric acid
- 1.5 g polycondensation product from 1 mole diphenylamine-4-diazonium sulfate and 1 mole formaldehyde precipitated as p-toluene sulfonate
- 5.44 g of a 13.8 wt-% dispersion in 3-methoxy-1-propanol, solid comprising 1 part of the polymer of Example 2 of U.S. Pat. No. 2,861,058 (polymer obtained by reaction of polyvinyl acetate and monoterephthalal-p-methoxyacetophenone) and 1 part of Irgalith blue GLG (Cu-phthalocyanine C.I.15:3, available from Ciba-Geigy)

These components were dissolved under stirring in 100 ml of a mixture comprising
- 30 parts by volume methyl glycol
- 45 parts by volume methanol
- 25 parts by volume methyl ethyl ketone.

The coating solution was applied to an electrochemically roughened and anodized aluminum foil that had been subjected to an aftertreatment using an aqueous solution of polyvinyl phosphonic acid by means of common methods and the plate was dried for 5 minutes at 92° C. The coating weight of the printing layer was approx. 1.0 g/m².

The plate was exposed and developed as described in Example 1. The gray wedge was completely covered only on step 1 and partially covered only up to step 4.

A press test was performed as described in Example 1 and plate wear was observed after 50,000 copies.

Those skilled in the art having the benefit of the teachings of the present invention as hereinabove set forth, can effect numerous modifications thereto. These modifications are to be construed as being encompassed within the scope of the present invention as set forth in the appended claims.

What is claimed is:

1. A copolymer comprising the units A, B, C, D and optionally E, wherein A is present in an amount of about 25 to 55 mol % and is of the formula

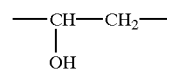 (A)

B is present in an amount of about 0.5 to 25 mol % and is of the formula

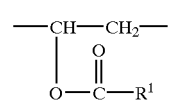 (B)

wherein R¹ is selected from the group consisting of alkyl, aryl and aralkyl;

C is present in an amount of about 0.5 to 40 mol % and is of the formula (C)

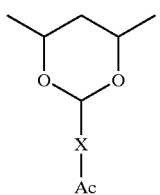

wherein X is an aliphatic or aromatic spacer group, and Ac is an acidic group selected from the group consisting of —COOH, —SO$_3$H, —SO$_2$NR$^9$R$^{10}$ with R$^9$ and R$^{10}$ independently being selected from hydrogen and alkyl; and when X is phenylene, Ac can also be OH, D is present in an amount of about 20 to 70 mol % and is of the formula (D)

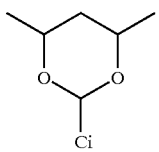

wherein Ci is selected from the group consisting of Ci-1, Ci-2, Ci-3 and Ci-4 which are represented by the following formulae (Ci-1)

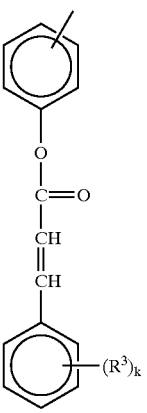

(Ci-2)

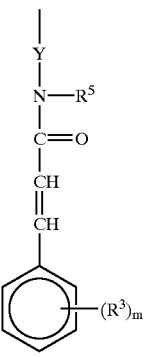

(Ci-3)

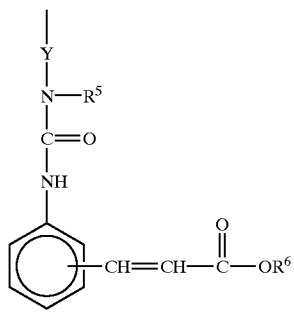

(Ci-4)

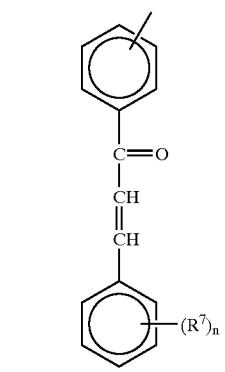

wherein:
k, m and n are integers independently selected from 0 to 5,
R$^3$, R$^4$ and R$^7$ are independently selected from the group consisting of alkyla
alkoxy, —COOR$^8$, —NR$^9$R$^{10}$, —NH—CO—CH$_3$, halogen, and cyano,
R$^8$ is selected from hydrogen and alkyl,
R$^9$ and R$^{10}$ are independently selected from hydrogen and alkyl,
R$^5$ is selected from the group consisting of hydrogen, alkyl, aryl and aralkyl,
R$^6$ is selected from the group consisting of alkyl, aryl and aralkyl and
Y is selected from the group consisting of alkylene, arylene and arylenealkylene and E is present in an amount of about 0 to 50 mol % and is of the formula (E)

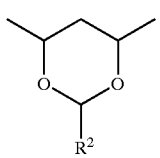

wherein R$^2$ is selected from the group consisting of alkyl, aryl and aralkyl groups.

2. The copolymer of claim 1, wherein R$^1$ is alkyl.

3. The copolymer of claim 1, wherein X is selected from the group consisting of C$_1$–C$_8$ alkylene and C$_6$–C$_{14}$ arylene.

4. The copolymer of claim 3, wherein Ac is selected from the group consisting of —COOH and —SO$_2$NR$^9$R$^{10}$ with R$^9$ and R$^{10}$ being as defined above.

5. The copolymer of claim 1 wherein Ci is of formula (Ci-1).

6. The copolymer of claim 5 wherein k is 0 or 1 and $R^3$ is selected from the group consisting of alkyl and alkoxy.

7. The copolymer of claim 1, wherein Ci is of formula (Ci-2).

8. The copolymer of claim 7, wherein m is 0 or 1 and $R^4$ is selected from the group consisting of alkyl and alkoxy, $R^5$ is an alkyl group and Y is an alkylene group.

9. The copolymer of claim 1, wherein Ci is of formula (Ci-3).

10. The copolymer of claim 9, wherein Y is an alkylene group, $R^5$ is an alkyl group and $R^6$ is an alkyl group.

11. The copolymer of claim 1, wherein Ci is of formula (Ci-4).

12. The copolymer of claim 11, wherein $R^7$ is selected from the group consisting of alkyl and alkoxy and n is 0 or 1.

13. The copolymer of claim 1, wherein unit E is present in an amount of about 1 to 25 mol % and $R^2$ is selected from the group consisting of alkyl, aryl and aralkyl.

14. The copolymer of claim 1, having a weight average molecular weight $M_w$ of from about 40,000 to about 230,000 g/mol.

15. A radiation-sensitive composition comprising
  (i) a copolymer comprising the units A, B, C, D and optionally E, wherein A is present in an amount of about 25 to 55 mol % and is of the formula

B is present in an amount of about 0.5 to 25 mol % and is of the formula

wherein $R^1$ is selected from the group consisting of alkyl, aryl and aralkyl C is present in an amount of about 0.5 to 40 mol % and is of the formula

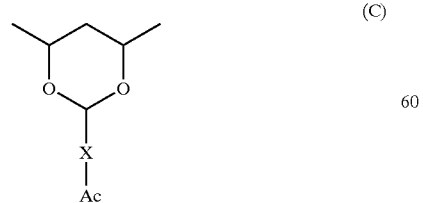

wherein X is an aliphatic or aromatic spacer group, and Ac is an acidic group selected from the group consisting of —COOH, —SO$_3$H, —SO$_2$NR$^9$R$^{10}$ with $R^9$ and $R^{10}$ independently being selected from hydrogen and alkyl; and when X is phenylene, Ac can also be OH, D is present in an amount of about 20 to 70 mol % and is of the formula

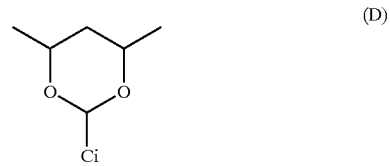

wherein Ci is selected from the group consisting of Ci-1, Ci-2, Ci-3 and Ci-4 which are represented by the following formulae

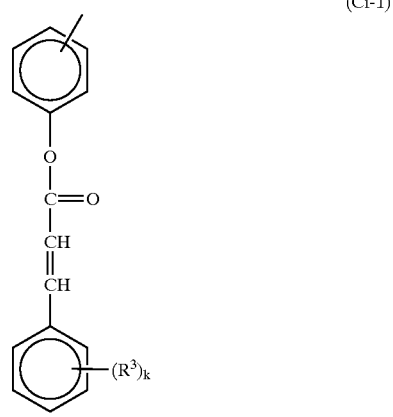

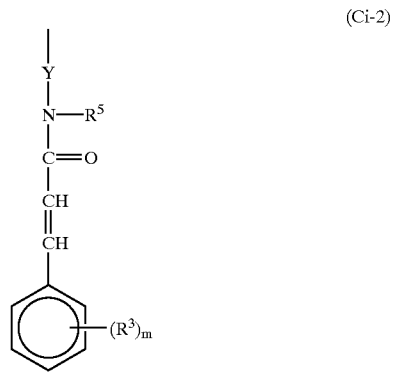

-continued

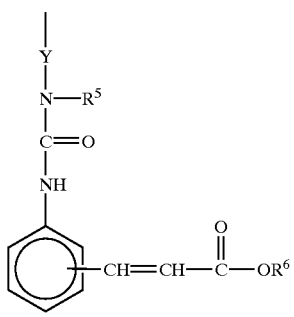
(Ci-3)

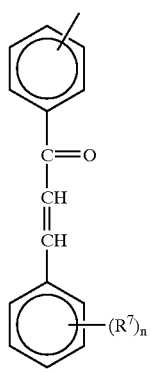
(Ci-4)

wherein:
k, m and n are integers independently selected from 0 to 5,
R³, R⁴ and R⁷ are independently selected from the group consisting of alkyl, alkoxy, —COOR⁸, —NR⁹R¹⁰, —NH—CO—CH₃, halogen, and cyano,
R⁸ is selected from hydrogen and alkyl,
R⁹ and R¹⁰ are independently selected from hydrogen and alkyl,
R⁵ is selected from the group consisting of hydrogen, alkyl, aryl and aralkyl,
R⁶ is selected from the group consisting of alkyl, aryl and aralkyl and
Y is selected from the group consisting of alkylene, arylene and arylenealkylene; and
E is present in an amount of about 0 to 50 mol % and is of the formula

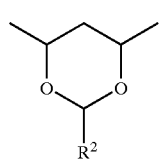
(E)

wherein R² is selected from the group consisting of alkyl, aryl and aralkyl groups; and
(ii) optionally at least one member selected from the group consisting of photosensitizers for photocyclo addition, diazo resins, colorants, exposure indicators, surfactants, stabilizing acids and plasticizers.

16. The radiation-sensitive composition of claim 15 comprising a diazo resin.

17. The radiation-sensitive composition of claim 15 comprising at least one photosensitizer for photocyclo addition.

18. A radiation-sensitive element comprising (a) a substrate and (b) a radiation-sensitive layer wherein the radiation-sensitive layer comprises
(i) a copolymer comprising the units A, B, C, D and optionally E, wherein A is present in an amount of about 25 to 55 mol % and is of the formula

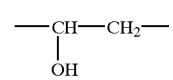
(A)

B is present in an amount of about 0.5 to 25 mol % and is of the formula

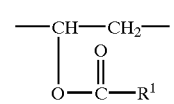
(B)

wherein R¹ is selected from the group consisting of alkyl, aryl and aralkyl

C is present in an amount of about 0.5 to 40 mol % and is of the formula

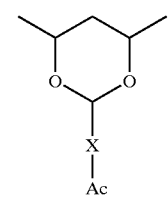
(C)

wherein X is an aliphatic or aromatic spacer group, and Ac is an acidic group selected from the group consisting of —COOH, —SO₃H, —SO₂NR⁹R¹⁰ with R⁹ and R¹⁰ independently being selected from hydrogen and alkyl; and when X is phenylene, Ac can also be OH, D is present in an amount of about 20 to 70 mol % and is of the formula

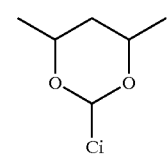
(D)

wherein Ci is selected from the group consisting of Ci-1, Ci-2, Ci-3 and Ci-4 which are represented by the following formulae

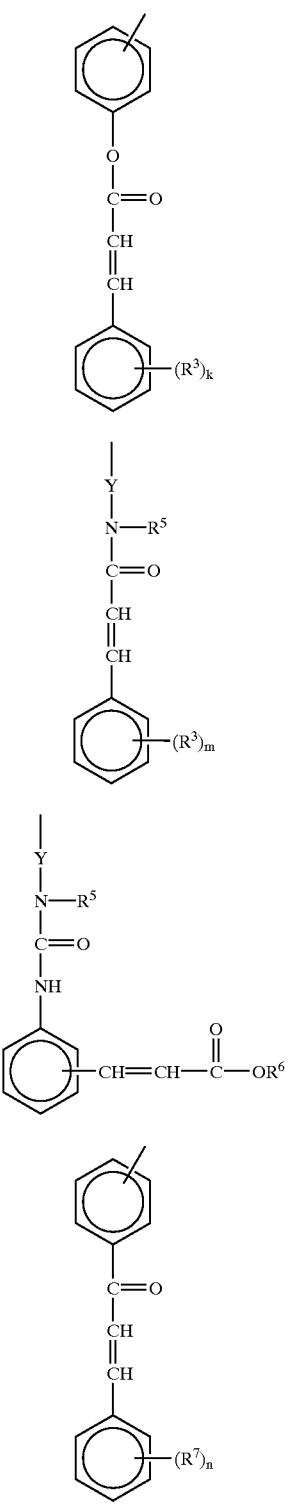

(Ci-1)

(Ci-2)

(Ci-3)

(Ci-4)

wherein:
k, m and n are integers independently selected from 0 to 5, $R^3$, $R^4$ and $R^7$ are independently selected from the group consisting of alkyl, alkoxy, —$COOR^8$, —$NR^8R^{10}$, —NH—CO—$CH_3$, halogen, and cyano, $R^8$ is selected from hydrogen and alkyl, $R^9$ and $R^{10}$ are independently selected from hydrogen and alkyl, $R^5$ is selected from the group consisting of hydrogen, alkyl, aryl and aralkyl, $R^6$ is selected from the group consisting of alkyl, aryl and aralkyl and Y is selected from the group consisting of alkylene, arylene and arylenealkylene, and E is present in an amount of about 0 to 50 mol % and is of the formula

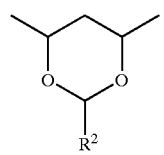

(E)

wherein $R^2$ is selected from the group consisting of alkyl, aryl and aralkyl groups; and (ii) optionally at least one member selected from the group consisting of photosensitizers for photocyclo addition, diazo resins, colorants, exposure indicators, surfactants, stabilizing acids and plasticizers.

19. The radiation-sensitive element of claim 18 wherein the substrate is an optionally pretreated aluminum foil.

20. The radiation-sensitive element of claim 19, wherein the radiation-sensitive layer comprises a diazo resin.

21. The radiation-sensitive element of claim 19, wherein the radiation-sensitive layer comprises a photosensitizer for photocyclo addition.

22. The radiation-sensitive element of claim 19, wherein the element further comprises between the substrate and the radiation-sensitive layer a further layer containing a diazo resin.

23. The radiation-sensitive element of claim 22, wherein the radiation-sensitive layer comprises a diazo resin.

24. A method of providing an image, comprising
(a) providing a radiation-sensitive element as defined in claim 18
(b) imagewise exposure to radiation
(c) subjecting the imagewise exposed element to a developing treatment.

* * * * *

UNITED STATES PATENT AND TRADEMARK OFFICE
CERTIFICATE OF CORRECTION

PATENT NO.    : 6,596,456 B2
DATED         : July 22, 2003
INVENTOR(S)   : Baumann et al.

It is certified that error appears in the above-identified patent and that said Letters Patent is hereby corrected as shown below:

<u>Title page,</u>
Item [57], ABSTRACT,
Figure Ci-2, delete "$(R^3)$" and insert therefore -- $(R^4)$ --;

<u>Column 21,</u>
Line 65, figure Ci-2, delete "$(R^3)$" and insert therefore -- $(R^4)$ --;

<u>Column 22,</u>
Line 35, delete "alkyla" and insert therefore -- alkyl, --;

<u>Column 24,</u>
Line 61, figure Ci-2, delete "$(R^3)$" and insert therefore -- $(R^4)$ --;

<u>Column 27,</u>
Line 30, figure Ci-2, delete "$(R^3)$" and insert therefore -- $(R^4)$ --;

<u>Column 28,</u>
Line 6, delete "$-NR^8R^{10}$" and insert therefore -- $-NR^9R^{10}$ --.

Signed and Sealed this

Eleventh Day of November, 2003

JAMES E. ROGAN
*Director of the United States Patent and Trademark Office*